United States Patent
Seeley et al.

(10) Patent No.: US 10,888,817 B2
(45) Date of Patent: Jan. 12, 2021

(54) PURGE GAS FEEDING MEANS, ABATEMENT SYSTEMS AND METHODS OF MODIFYING ABATEMENT SYSTEMS

(71) Applicant: Edwards Limited, Burgess Hill (GB)

(72) Inventors: Andrew Seeley, Burgess Hill (GB); Duncan Michael Price, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 0 days.

(21) Appl. No.: 16/500,665

(22) PCT Filed: Mar. 28, 2018

(86) PCT No.: PCT/GB2018/050844
§ 371 (c)(1),
(2) Date: Oct. 3, 2019

(87) PCT Pub. No.: WO2018/185469
PCT Pub. Date: Oct. 11, 2018

(65) Prior Publication Data
US 2020/0061535 A1  Feb. 27, 2020

(30) Foreign Application Priority Data
Apr. 4, 2017 (GB) .................................. 1705400.8

(51) Int. Cl.
*B01D 53/75* (2006.01)
*F23G 7/06* (2006.01)

(52) U.S. Cl.
CPC ............. *B01D 53/75* (2013.01); *F23G 7/061* (2013.01)

(58) Field of Classification Search
None
See application file for complete search history.

(56) References Cited

U.S. PATENT DOCUMENTS

2002/0159924 A1  10/2002  Arno et al.
2005/0135984 A1   6/2005  Ferron et al.
(Continued)

FOREIGN PATENT DOCUMENTS

EP  1143197 A1  10/2001

OTHER PUBLICATIONS

Forest, K. A Look in to How Each O-Ring is Used. BrennanBlog, Brennan Inc. pp. 1-6. https://blog.brennaninc.com/an-o-ring-breakdown-how-is-each-one-used—(Year: 2018).*
(Continued)

*Primary Examiner* — Jelitza M Perez
(74) *Attorney, Agent, or Firm* — Theodore M. Magee; Westman, Champlin & Koehler, P.A.

(57) ABSTRACT

A purge gas feeding means, an abatement system comprising such a means and a method of modifying an abatement system to include such a purge gas feeding means is disclosed. The purge gas feeding means comprises a plurality of paths running from an outer perimeter of the purge gas feeding means to an inner surface, the inner surface comprising a purge gas outlet for outputting the purge gas into the abatement system; wherein a cross sectional area of the plurality of paths increases from the outer perimeter to the inner surface such that a pressure of the purge gas falls flowing along the paths drops.

19 Claims, 3 Drawing Sheets

(56) References Cited

U.S. PATENT DOCUMENTS

| | | | |
|---|---|---|---|
| 2005/0252449 A1 | 11/2005 | Nguyen et al. | |
| 2007/0172399 A1* | 7/2007 | Clark | B01D 53/74 422/182 |
| 2007/0190469 A1 | 8/2007 | Clark et al. | |
| 2007/0272201 A1* | 11/2007 | Amano | F23D 17/002 123/295 |
| 2008/0095675 A1 | 4/2008 | Hartung | |
| 2008/0131335 A1* | 6/2008 | Balk | F01N 13/141 422/177 |
| 2009/0142716 A1* | 6/2009 | Jubb | F23R 3/14 431/9 |
| 2009/0255259 A1* | 10/2009 | Kastrup | F23R 3/283 60/737 |
| 2009/0320490 A1* | 12/2009 | Nilsson | F23R 3/12 60/772 |
| 2012/0192793 A1 | 8/2012 | Fukumori | |

OTHER PUBLICATIONS

British Search Report dated Oct. 11, 2017 and Examination Report dated Oct. 13, 2017 for corresponding British Application No. GB1705400.8.

PCT Notification of Transmittal of the International Search Report and the Written Opinion of the International Searching Authority, or the Declaration, PCT Search Report and Written Opinion dated Jun. 29, 2018 for corresponding PCT Application No. PCT/GB2018/050844.

* cited by examiner

PURGE GAS FEEDING MEANS, ABATEMENT SYSTEMS AND METHODS OF MODIFYING ABATEMENT SYSTEMS

CROSS-REFERENCE OF RELATED APPLICATION

This application is a Section 371 National Stage Application of International Application No. PCT/GB2018/050844, filed Mar. 28, 2018, and published as WO 2018/185469 A1 on Oct. 11, 2018, the content of which is hereby incorporated by reference in its entirety and which claims priority of British Application No. 1705400.8, filed Apr. 4, 2017.

FIELD

The invention relates to purge gas feeding means for the supply of purge gas to an abatement system, to those abatement systems and to methods of modifying abatement systems.

BACKGROUND

Gas abatement systems are known. Such systems are used for the treatment of effluent gases arising from manufacturing or fabrication process. These manufacturing or fabrication processes may use highly toxic gases many of which go through the process tool without reacting to form other gaseous species and/or particulates. These gases which are exhausted from such process tools require treatment prior to exhausting to the atmosphere.

Gas abatement systems are used in the treatment of such gases.

Such treatments may comprise a plurality of stages which include heating in a burner, cooling in a quench section and washing with a liquid in a wet scrubber. The different treatments are performed in different zones or sections of the abatement system and the different zones operate under different conditions.

The use of liquids in the scrubbing process can cause contamination in other chambers. It is desirable to isolate an upstream zone from liquid being added to a downstream zone. In particular it is desirable to protect surfaces at or close to the zone boundaries from becoming contaminated with the liquid or particles which may encourage further depositions and cause blockages.

The discussion above is merely provided for general background information and is not intended to be used as an aid in determining the scope of the claimed subject matter. The claimed subject matter is not limited to implementations that solve any or all disadvantages noted in the background.

SUMMARY

A first aspect of the present invention provides a purge gas feeding means for feeding a purge gas to an abatement system, said purge gas feeding means comprising a plurality of paths running from an outer perimeter of said purge gas feeding means to an inner surface, said inner surface comprising a purge gas outlet for outputting said purge gas into said abatement system; wherein a cross sectional area of said plurality of paths increases from said outer perimeter to said inner surface such that a pressure of said purge gas when flowing along said paths drops.

The inventors of the present invention recognised that certain surfaces in abatement systems are prone to particulate deposition. Such deposition can cause blockages and leads to an increased maintenance or servicing requirement. In particular where there is an abrupt change in conditions between zones the likelihood of particle deposition may increase. Furthermore, the addition of liquid in a liquid scrubbing zone can lead to surfaces upstream of the inlet becoming wet and particles are more likely to stick to a wet surface. This problem has been addressed by the use of a purge gas feeding means which supplies purge gas to the abatement system. The purge gas is not selected for its diluent properties but it is rather used to form a shield or boundary layer to flow over surfaces that it seeks to protect.

In order for the purge gas to effectively protect surfaces it is desirable that the gas flows evenly to cover substantially the whole surface. This is achieved by using flow paths with increasing area such that the pressure drops as the purge gas flows along the paths. This evens out the flow leading to a flow that can effectively cover and protect a surface at which it is directed. In general paths from an outer perimeter to an inner perimeter will reduce in surface area as the surface area of the perimeter reduces. However, in this case the inventors recognised the advantage of an increasing cross section area for spreading the flow and the feed means was therefore designed with this in mind.

Although the purge gas feeding means may have a number of shapes, in some embodiments it comprises a continuously curved outer perimeter and inner surface. Such continuously curved surfaces may have a circular or ring type form or they may be elliptical or some other continuously curved form.

Continuously curved forms are often used in devices for fluid flow as they are naturally strong and do not have discontinuities which may lead to eddies and particle formation.

In some embodiments said plurality of paths are angled to provide a tangential component to said purge gas flow.

It may be advantageous if, in addition to allowing expansion of the purge gas, the paths are angled to provide a rotational component to the purge gas flow such that some spinning of the flow is triggered. This spinning in addition to the expansion helps provide an even flow that can coat a surface leading to effective protection of such a surface from other materials present which may be corrosive, particulate or liquid.

In some embodiments, said purge gas feeding means comprises an annular disk comprising said plurality of paths, said outer perimeter comprising an outer circumference of said annular disk and said inner surface comprising an inner circumference.

As noted previously, curved surfaces may have advantages and the gas feeding means may comprise an annular disc. Such a form may be easy to fit to a gas abatement system with the inner circumference of the disc providing a surface from which the purge gas is output. In this way the purge gas is output from around a surface and this again helps provide effective coverage of such a surface by the gas.

In other embodiments, said purge gas feeding means comprises a substantially rectilinear outer perimeter and inner surface.

Although circular formations may be preferred, rectilinear ones can also be used. In this regard, rectilinear formations may have sharp corners or they may be designed to have rounded corners. The rectilinear form may be a rectangle or some other form with inner and outer surfaces that comprise portions that are angled with respect to each other.

In some embodiments, said plurality of paths are angled such that they run in a direction that is not normal to said perimeter and thereby introduce a rotational component to said purge gas flow.

Where the purge gas feeding means is rectilinear, it may also be advantageous to introduce a rotational component to the purge gas flow and this can be done by angling of the paths, such that the gas not only expands but is provided with a spinning motion.

In some embodiments, said purge gas feeding means comprises a substantially rectilinear component with a height that is substantially less than said inner perimeter.

Where the purge gas feeding means is substantially rectilinear then rather than having a disc form, it may have a flat gasket type rectilinear type shape, such that again it is easy to incorporate into a gas abatement system, perhaps at a junction between two zones.

Although the plurality of paths may have a number of forms provided that their cross sectional area increases so that the gas expands, in some embodiments, said plurality of paths are each of an acute triangular form.

An acute triangular form is a way of providing the expansion within a limited area while providing low resistance to flow.

In some embodiments, one side of each of said paths is angled substantially tangentially to said inner circumference and said acute angle of said triangular form is between 5° and 20°.

Where the paths are of an acute triangular form, then they may be angled such that the acute angle is between 5° and 20°, preferably 100 and one side of each of the path is angled substantially tangentially to the inner circumference of the purge gas feeding means.

In some embodiments, said plurality of paths coalesce to form a single purge gas outlet at said inner surface.

As the paths' area increases from the outer to the inner surface, the paths get closer and in some embodiments they may be designed such that they coalesce and there is a single purge gas outlet at the inner surface. This is an effective way of providing a gas that is input to the abatement system over a wide area.

Alternatively, in some embodiments said plurality of paths form a plurality of purge gas outlets at said inner surface.

The outlets may not quite coalesce and may be formed of a plurality of individual outlets. This may be advantageous in some embodiments.

Although the paths may be formed in a number of ways, in some embodiments said plurality of paths comprise grooves within said purge gas feeding means.

The paths may be passages within the purge gas feeding means or they may simply be grooves on one or more surfaces. When the purge gas feeding means is held between other surfaces in situ, these grooves form the purge gas paths.

In some embodiments, a surface of said purge gas feeding means comprising said purge gas outlet is angled at said inner surface to form a convex surface over which said purge gas flows.

The inner surface of the purge gas feeding means where the purge gas outlet is located may be angled to form a convex surface. The convex surface, with a Coandă profile for example, is a shape which the gas flow will tend to adhere to such that providing this shaped surface at the outlet provides a surface that the purge gas will tend to flow over on being output, allowing it to be directed towards the surface that the purge gas is to protect.

A second embodiment of the present invention provides an abatement system comprising a radiant burner chamber and a liquid scrubbing chamber downstream of said radiant burner chamber, said abatement system comprising a purge gas feeding means according to a first aspect arranged between said radiant burner chamber and said liquid scrubbing chamber.

In some embodiments, said purge gas feeding means is mounted between flanges that join said radiant burner chamber to said liquid scrubbing chamber.

The purge gas feeding means may be configured such that it is suitable for mounting between the flanges that join the radiant burner chamber to the liquid scrubbing chamber. This allows the purge gas feeding means to be mounted within a standard abatement system and provide purge gas at the interface point between two chambers. In this regard, different chambers or zones within an abatement system generally operate under different conditions and at the interface, the changing conditions can cause particle deposition. Protecting the surfaces at these interface points is therefore advantageous and providing a purge gas feeding means which outputs a purge gas into this interface section can alleviate these problems.

In other embodiments, said purge gas feeding means comprises at least one of said flanges that join said radiant burner chambers to said liquid scrubbing chamber, said at least one of said flanges comprising said plurality of paths.

It may be that rather than placing a separate purge gas feeding means between the flanges that join the two chambers in the gas abatement system, one or more of the flanges may be adapted to provide the gas purging means itself. This adaptation would mean providing the surface of one or more of the flanges with the gas flow paths such that a purge gas port inputting purge gas to an outer perimeter of the flange will provide purge gas that travels through the purge gas paths expanding as it travels to enter the interface region between the two chambers in the abatement system.

In some embodiments, said flanges are sealed by an O-ring, a groove retaining an O-ring retainer forming a purge gas supply gallery.

The flanges between the abatement chambers are generally sealed by an O-ring as it is important that the process gases which may be toxic do not leak from the system. An O-ring may have a groove for retaining an O-ring retainer and this groove forms a purge gas supply gallery where the purge gas feeding means is located between the flanges.

In some embodiments, said abatement system further comprises an intermediate surface between said purge gas feed outlet and a liquid inlet of said liquid scrubbing chamber.

In some embodiments, said purge gas feed outlet is arranged to direct said purge gas to flow over said intermediate surface.

The intermediate surface between the purge gas feed outlet and the liquid inlet of the liquid scrubbing chamber is particularly prone to corrosion and particle deposition owing to its location in a zone where there is an abrupt change in the process gas conditions and where liquid from liquid inlet is close, such that liquid may adhere to the intermediate surface. Arranging the purge gas feed outlets such that the purge gas is directed to flow over the intermediate surface will protect this surface from corrosive materials and particle deposition in a simple yet elegant fashion allowing the maintenance and servicing requirements of the system to be reduced.

In some embodiments, said purge gas outlet is arranged such that said gas flow is directed to flow across an upper perimeter of said intermediate surface and to flow and form a film over said intermediate surface.

The purge gas outlet may be arranged such that it is just above top of the intermediate surface such that it flows over the upper perimeter and forms a film over the intermediate surface which faces the gas flow in the abatement system.

In some embodiments, said intermediate surface comprises a solid surface forming a portion of a passage for gas flowing through said abatement system.

In some embodiments, said liquid inlet comprises a weir formation around a perimeter of a gas flow passage within said abatement system, and said intermediate surface comprises a surface centred on a same point as a centre of said weir formation and having a smaller cross section than a cross section of said weir formation.

Liquid inlets of many liquid scrubbing systems comprise a weir formation and the intermediate surface above the weir formation and between the zones may be of a similar form to the weir formation having the same central point, but having a smaller cross section such that it extends over the weir formation. This allows it to direct liquid away from an adjacent upstream zone.

In some embodiments, said intermediate surface adjacent to said purge gas outlet comprises a convex form.

As noted previously, a gas flow will tend to adhere to a convex surface and thus it may be advantageous if the intermediate surface adjacent to the purge gas outlet comprises a convex form. If the purge gas outlet also has such convex form, the gas will be effectively directed away from the purge gas outlet and along the intermediate surface providing an effective covering of such a surface.

A third aspect of the present invention provides a method of modifying a gas abatement system comprising: separating a radiant burner chamber and a liquid scrubbing chamber of said gas abatement system; providing a gas purge feed means between said radiant burner chamber and said liquid scrubbing chamber, said gas purge feed means comprising a plurality of paths running from an outer perimeter of said purge gas feed means to an inner surface of said purge gas feed means, said inner surface comprising a purge gas outlet for outputting said purge gas into said abatement system; wherein a cross sectional area of said plurality of paths increases from said outer perimeter to said inner surface such that a pressure of said purge gas flowing along said paths falls, providing said gas abatement system with a purge port operable to supply purge gas to said purge gas feed means; and fastening said radiant burner chamber and said liquid scrubbing chamber together.

In some embodiments, said step of providing said gas purge feed means comprises replacing a gasket held between flanges joining said liquid scrubbing chamber to said radiant burner chamber with said purge gas feed means of a first aspect.

Conventionally, the radiant burner and liquid scrubbing chamber of a gas abatement system have been joined using flanges and these generally comprise a gasket which may be made of some ceramic material to protect the O-ring from the hot gases exiting from the radiant burner. This ceramic gasket provides an ideal location for placing a purge gas feeding means according to a first aspect of the invention. Thus, a conventional gas abatement system may be modified by separating the two chambers, removing the gasket that was previously there and replacing it with a purge gas feeding means according to a first aspect. In this regard, where the gas abatement system has a circular profile, then the purge gas feeding means may have the ring shaped disc form. Where the gas abatement system has a rectilinear profile, then the purge gas feeding means will have a rectilinear form.

The gas abatement system is also provided with a purge port such that purge gas can be supplied to the purge gas feeding means and the flanges are then fastened together with the purge gas feeding means in place. The purge gas feeding means will act to protect the O-ring from the heat of the radiant burner as the flow of gas will help provide cooling.

In some embodiments, said step of providing said gas purge feed means comprises providing at least one of said flanges with a plurality of paths running from an outer perimeter of said flange to an inner surface, said inner surface comprising a purge gas outlet for outputting said purge gas into said abatement system.

In an alternative method, rather than placing a separate purge gas feeding means between the two flanges, one of the flanges may be adapted to act as a purge gas feeding means. This may be done by, for example, replacing the weir section with a new weir section with a flange having the appropriate paths. Alternatively, the paths may be machined into an existing flange.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Before discussing the embodiments in any more detail, first an overview will be provided.

A purge gas feeding means for feeding a purge gas to an abatement system is provided to protect some surfaces within the gas abatement system from contamination by particle deposition or corrosion from corrosive gases. Gas abatement systems comprise different zones which are designed for different purposes and conditions in each zone may be very different. This change in conditions may lead to undesirable and unforeseen effects in the boundary regions between zones, such as particle deposition and corrosion on surfaces in these regions. In particular, where a liquid is added to one stage of a gas abatement system, liquid migration to another zone may cause wetting of the surfaces under conditions where such wet surfaces are undesirable.

A purge gas is added to such abatement systems with the intention of providing some coating and thereby protection of vulnerable surfaces both from corrosive gases and from the liquid.

Although a purge gas added to a system may provide some protection of neighbouring surfaces, in order to provide improved protection it has been found that providing a plurality of feed paths with an increasing cross section such that the pressure of the purge gas falls, leads to the input of the purge gas being evened out so that flow from the different paths is substantially equalised and a uniform flow of purge gas provided.

A purge gas may be any gas that would be suitable to provide a boundary layer to protect surfaces. It is relatively unreactive and also generally non-toxic. A gas such as Nitrogen, Argon, or a mixture of gases such as Air or any mixture of inert gases, may be used.

The purge gas feeding means may be part of the abatement system when it is manufactured or it may be a separate component that is added to the system to provide improved protection of surfaces and reduce servicing requirements.

Figure 1:
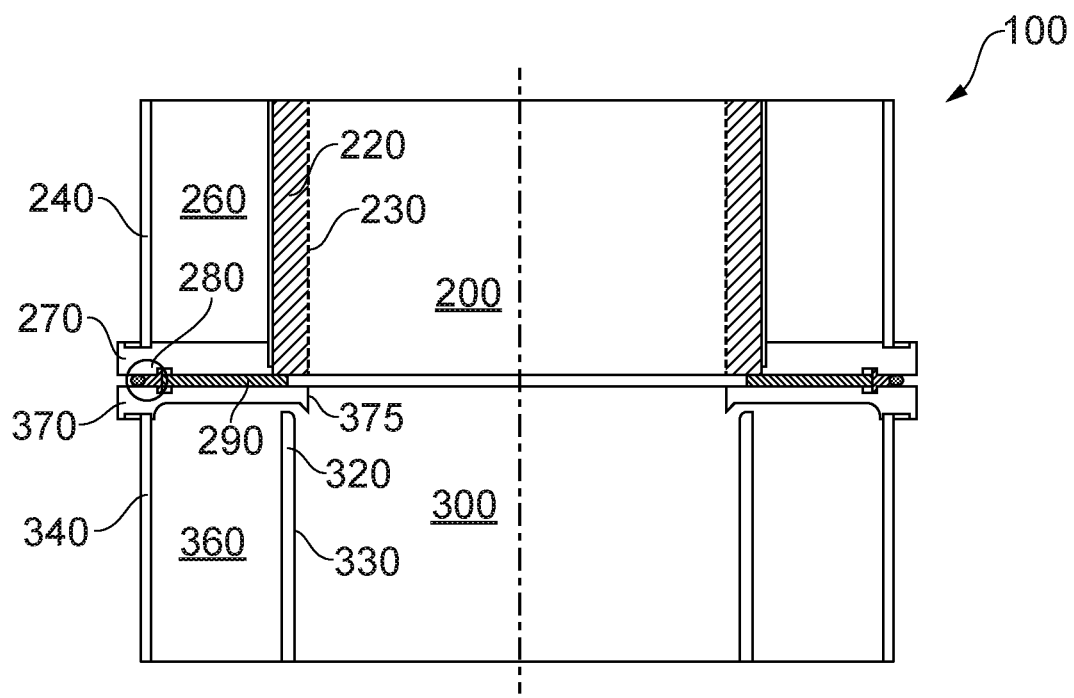
FIG. 1 illustrates an abatement system and an intermediate surface to be protected by a purge gas feeding means according to an embodiment.
Figure 2A:
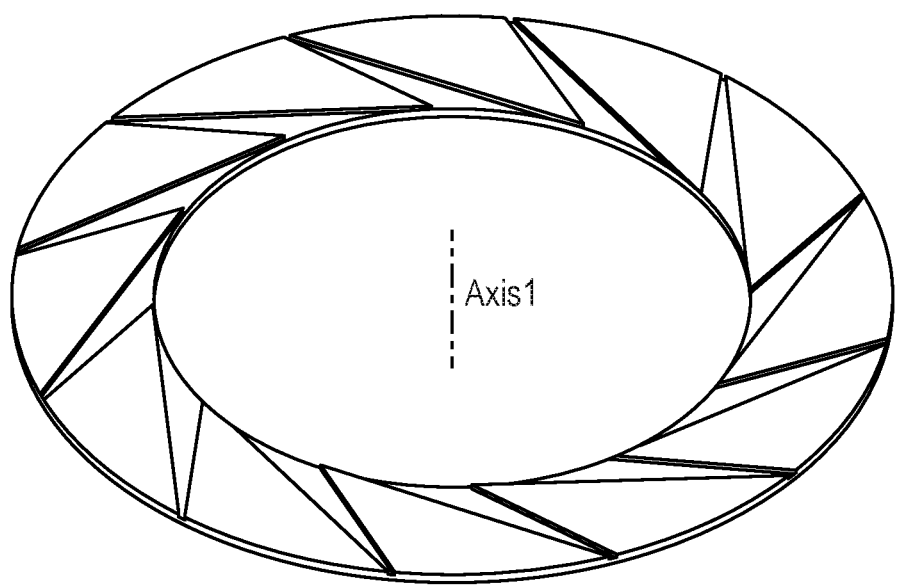
FIGS. 2a and 2b provide examples of purge gas feeding means according to embodiments.
Figure 2B:
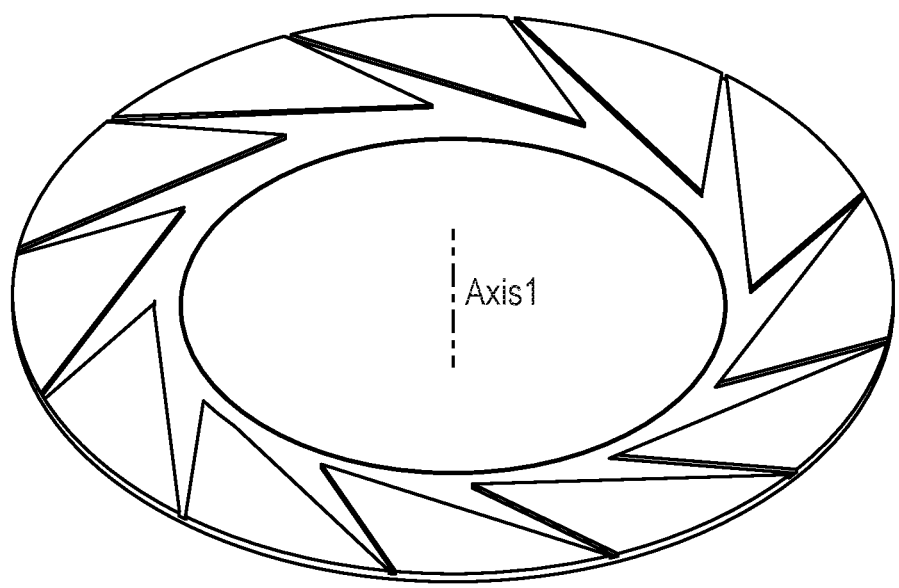

FIG. 1 shows a section through an abatement system having a ceramic gasket 290 which system can be modified according to an embodiment by replacing the ceramic gasket with a purge feeding means such as is shown in FIGS. 2a and 2b.

The abatement system is a radiant burner abatement system 100 with a radiant burner zone 200 comprising a porous element 220, and housing 240 which together form a premix plenum 260 through which a mixture of fuel and air is admitted for combustion on the inner surface 230 of the radiant burner zone 200.

The radiant burner assembly is mounted on a water-cooled weir assembly 300 comprising an inner tube 320 an outer housing 340 and a passage 360 within which water is caused to swirl by tangential jets (not shown) which movement of the water causes a complete or near complete coverage of the inner wall 330.

The burner and weir are joined via flanges 270, 370 and sealed via a trapped 'o'-ring 280 protected from heat via a ceramic fibre packing 290.

In operation, it is found that on processes producing a lot of powder, for example silica, $SiO_2$, formed from the combustion of silicon-containing species such as $SiH_4$, $Si_2H_6$, $Si(CH_3)_4$, $Si(OC_2H_5)_4$ grows from the inner edge 375 of flange 370 up into the radiant burner, ultimately causing a blockage.

Embodiments of the present invention seek to substantially reduce the growth of material on the edge 375 of flange 370 thereby largely preventing or at least reducing the occurrence of blockage of the radiant burner, increasing mean time between service (MTBS).

In one embodiment, the ceramic gasket 290, is replaced by a gas purge feeding means 290 in the form of a hollow disk or plate. On one surface, in this case on the upper surface, of the plate a plurality of passages is formed. These are of acute triangular form, arranged with one side substantially tangential to the inner diameter and with the other side at an angle of 10 degrees or so to the first. These are arrayed about the axis and there are a sufficient number that the discharge ends of the passages nearly coalesce. The passages of paths have an increasing cross section from the inlet to the outlet such that the purge gas pressure falls and the outlet provides a uniform flow of the expanded gas.

A version of this may have a radius or convex curve on the inner edge to urge the gas to follow the surface. A purge port is welded to the weir assembly. The groove that retains the trapped O-ring forms a convenient purge gas supply gallery.

In a further embodiment, rather than adding a plate to be held between the flanges the design of the top flange of the weir assembly is modified to include the features identified above. Alternatively the design of the bottom flange may be modified.

FIGS. 2a and 2b show the purge gas feeding means in more detail. As can be seen it has the form of a hollow disk which can be held between the flanges of the abatement system 100 of FIG. 1. The purge gas feeding means has gas flow paths with increasing cross section on one surface. These paths are angled component such that a rotational component is added to the purge gas flow. This rotational component, along with the increasing cross section and in some cases the angled inner surface provides a flow of gas that tends to adhere to and provide a shield for the surface that it is output over, that is in the embodiment of FIG. 1, intermediate surface 375. This coating flow of gas protects surface 375 from particulates in the gas flow FIG. 2b shows an alternative embodiment, where the acute angle of the triangle is larger such that the paths coalesce and the purge gas outlet is a single annular outlet.

Figure 3:
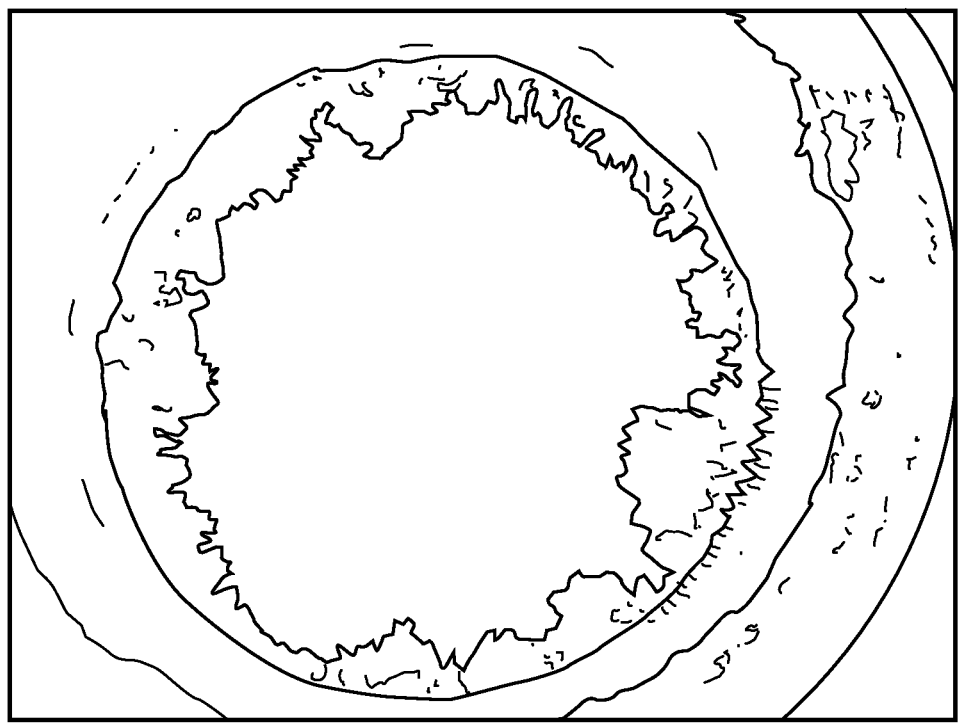
FIGS. 3 and 4 show the effect that an embodiment has on the solids build up on a burner liner at a water weir interface.
Figure 4:
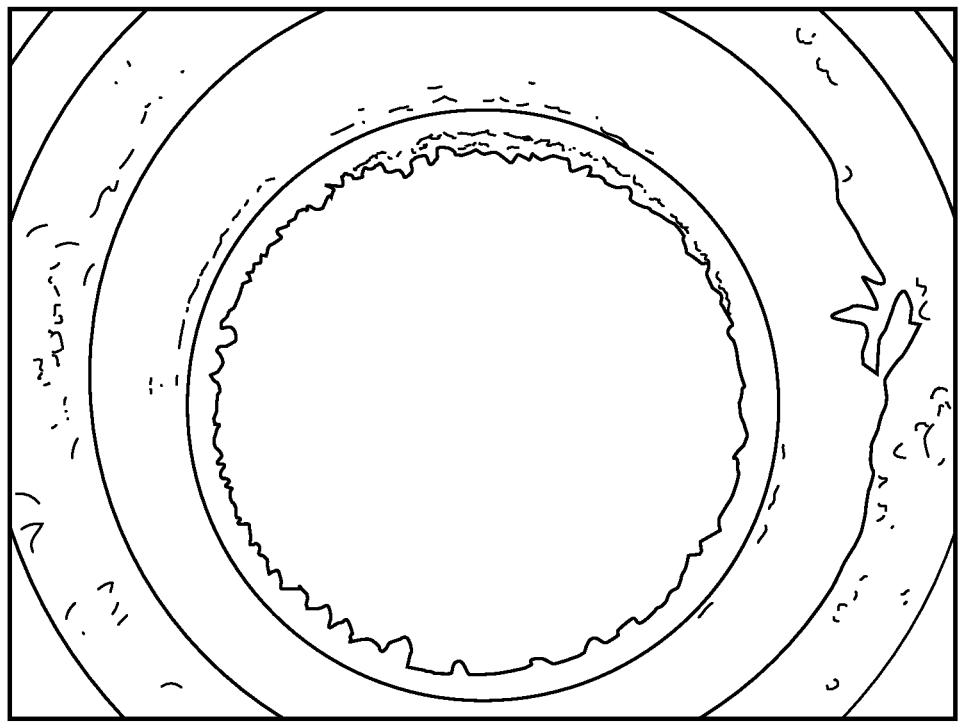

FIGS. 3 and 4 show the effect that an embodiment has on the solids build up on a burner liner at a water weir interface with and without the purge gas weir or flow of an embodiment. FIG. 3 shows the effect without the purge gas, while FIG. 4 shows how deposition is significantly reduced when a purge gas is used.

Although the embodiments show circular gas purge feeding means, it should be clear to a skilled person that where the abatement system has a rectilinear cross section, the disk may be replaced by a rectilinear gasket with paths on one surface.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A purge gas feeding means for feeding a purge gas to an abatement system, said purge gas feeding means comprising a plate comprising a top surface with a plurality of paths formed therein running from an outer perimeter of said plate to an inner surface defining a hole in the plate, said plurality of paths intersecting said inner surface to form at least one purge gas outlet at the inner surface for outputting said purge gas into said abatement system; wherein a cross sectional area of said plurality of paths increases from said outer perimeter to said inner surface such that a pressure of said purge gas falls flowing along said paths drops.

2. The purge gas feeding means according to claim 1, wherein said purge gas feeding means comprises a continuously curved outer perimeter and inner surface, wherein said plurality of paths are angled to provide a tangential component to said purge gas flow.

3. The purge gas feeding means according to claim 2, wherein said purge gas feeding means comprises an annular disk comprising said plurality of paths, said outer perimeter comprising an outer circumference of said annular disk and said inner surface comprising an inner circumference.

4. The wherein said purge gas feeding means comprises a substantially rectilinear outer perimeter and inner surface, wherein said plurality of paths are angled such that they run in a direction that is not normal to said perimeter and thereby introduce a rotational component to said purge gas flow and further wherein said purge gas feeding means comprises a substantially rectilinear component with a height that is substantially less than said inner surface.

5. The purge gas feeding means according to claim 2, wherein said plurality of paths are each of an acute triangular form, wherein one side of each of said paths is angled substantially tangentially to said inner surface said acute angle of said triangular form being between 5° and 20°.

6. The purge gas feeding means according to claim 1, wherein said plurality of paths form a plurality of purge gas outlets at said inner surface.

7. The purge gas feeding means according to claim 1, wherein said plurality of paths comprise grooves within said purge gas feeding means.

8. The purge gas feeding means according to claim 1, wherein said inner surface of said purge gas feeding means comprising said at least one purge gas outlet is angled to form a convex surface over which said purge gas flows.

9. An abatement system comprising a radiant burner chamber and a liquid scrubbing chamber downstream of said radiant burner chamber, said abatement system comprising a purge gas feeding means according to claim 1 arranged between said radiant burner chamber and said liquid scrubbing chamber.

10. The abatement system according to claim 9, wherein said purge gas feeding means is mounted between flanges that join said radiant burner chamber to said liquid scrubbing chamber.

11. The abatement system according to claim 10, wherein said flanges are sealed by an O-ring, a groove retaining an O-ring retainer forming a purge gas supply gallery.

12. The abatement system according to claim 9, said abatement system further comprising an intermediate surface between said purge gas feed outlet and a liquid inlet of said liquid scrubbing chamber.

13. The abatement system according to claim 12, wherein said at least one purge gas feed outlet is arranged to direct said purge gas to flow over said intermediate surface.

14. The abatement system according to claim 12, wherein said at least one purge gas outlet is arranged such that said gas flow is directed to flow across an upper perimeter of said intermediate surface and to flow and form a film over said intermediate surface.

15. The abatement system according to claim 12, wherein said intermediate surface comprises a solid surface forming a portion of a passage for gas flowing through said abatement system.

16. The abatement system according to claim 12, wherein said liquid inlet comprises a weir formation around a perimeter of a gas flow passage within said abatement system, and said intermediate surface comprises a surface centered on a same point as a center of said weir formation and having a smaller cross section than a cross section of said weir formation.

17. The abatement system according to claim 16, wherein said intermediate surface extends beyond a top surface of said weir formation such that an inner portion of said intermediate surface is operable to direct liquid away from an adjacent upstream zone.

18. The abatement system according to claim 12, wherein said intermediate surface adjacent to said at least one purge gas outlet comprises a convex form.

19. A method of modifying a gas abatement system comprising:
separating a radiant burner chamber and a liquid scrubbing chamber of said gas abatement system;
providing a purge gas feed means between said radiant burner chamber and said liquid scrubbing chamber, said purge gas feed means comprising a top surface with a plurality of paths formed therein running from an outer perimeter of said purge gas feed means to an inner surface defining a hole of said purge gas feed means, said plurality of paths intersecting said inner surface to form at least one purge gas outlet at the inner surface for outputting said purge gas into said abatement system; wherein
a cross sectional area of said plurality of paths increases from said outer perimeter to said inner surface such that a pressure of said purge gas flowing along said paths falls;
providing said gas abatement system with a purge port operable to supply purge gas to said purge gas feed means; and
fastening said radiant burner chamber and said liquid scrubbing chamber together using flanges.

\* \* \* \* \*